United States Patent [19]
Marui et al.

[11] Patent Number: 5,253,181
[45] Date of Patent: Oct. 12, 1993

[54] PROGRAMMABLE ONE-BOARD COMPUTER, AND METHODS OF VERIFICATION OF LOGIC CIRCUIT AND ALTERATION TO ACTUAL CIRCUIT USING THE PROGRAMMABLE ONE-BOARD COMPUTER

[75] Inventors: Tomohiro Marui, Fuchuu; Yoshihiro Ishida; Hiroyuki Oka, both of Chiba, all of Japan

[73] Assignee: Kawasaki Steel Corporation, Kobe, Japan

[21] Appl. No.: 513,625

[22] Filed: Apr. 24, 1990

[30] Foreign Application Priority Data

Apr. 27, 1989 [JP] Japan ................ 1-110493
May 1, 1989 [JP] Japan ................ 1-112587
May 1, 1989 [JP] Japan ................ 1-112588

[51] Int. Cl.$^5$ .................................. G06F 15/60
[52] U.S. Cl. ..................... 364/489; 364/488; 364/578
[58] Field of Search ............. 364/488, 489, 490, 491, 364/578; 371/23

[56] References Cited

U.S. PATENT DOCUMENTS

| | | | |
|---|---|---|---|
| 4,590,581 | 5/1986 | Widdoes, Jr. | 364/578 |
| 4,635,218 | 1/1987 | Widdoes, Jr. | 364/578 |
| 4,636,966 | 1/1987 | Yamada et al. | 364/491 |
| 4,744,084 | 5/1988 | Beck et al. | 371/23 |
| 4,852,016 | 7/1989 | McGehee | 364/491 |
| 4,868,825 | 9/1989 | Koeppe | 364/578 |
| 4,924,429 | 5/1990 | Kurashita et al. | 364/578 |
| 4,931,946 | 6/1990 | Davindha et al. | 364/490 |
| 4,945,503 | 7/1990 | Takasaki | 364/578 |
| 4,947,357 | 8/1990 | Stewart et al. | 364/490 |
| 4,949,275 | 8/1990 | Nonaka | 364/490 |
| 5,025,368 | 6/1991 | Watanabe | 364/491 |
| 5,155,692 | 10/1992 | Lewandoski | 364/489 |

OTHER PUBLICATIONS

VLSI Systems Design Jul. 1988 pp. 3–8.
"Circuit Layout" by J. Soukup, Proceeding IEEE, vol. 69, pp. 1281–1304, Oct. 1981.
"Analysis of Placement Procedures For VLSI Standard Cell Layout", by M. R. Hartog, IEEE 23rd Design Automation Conf., 1986, pp. 314–319.
"Standard Cell VLSI Design: A Tutorial" by Kessler et al., IEEE Circuits and Devices Magazine, Jan. 1985, pp. 17–33.

*Primary Examiner*—Vincent N. Trans
*Attorney, Agent, or Firm*—Oliff & Berridge

[57] ABSTRACT

There is provided a programmable one-board computer comprising a system board including wirings, one or more of microprocessor chips disposed at the center of said system board, and a plurality of programmable logic devices (PLD) disposed to surround said one or more of the microprocessor chips. Each said PLD may include a memory for defining an internal circuit thereof or may substitute partly thereof for an external memory device, or said PLDs may be comprised of large scale PLDs as inner PLDs thereof and small scale PLDs as outer PLDs thereof. The programmable one-board computer can realize an actual circuit altered from a newly designed logic circuit and laid out on the same. The actual circuit laid on the same can be used for verification.

14 Claims, 7 Drawing Sheets

PROGRAMMABLE ONE-BOARD COMPUTER, AND METHODS OF VERIFICATION OF LOGIC CIRCUIT AND ALTERATION TO ACTUAL CIRCUIT USING THE PROGRAMMABLE ONE-BOARD COMPUTER

BACKGROUND OF THE INVENTION

1. Field of the Invention

The present invention relates to a programmable one-board computer, and methods of verification of a logic circuit and of alteration to an actual circuit using the programmable one-board computer being capable of accepting varieties of systems and of accepting alterations of those systems quickly with ease by making use of internal circuit of programmable logic devices (PLD) of which are erasable/reconfigurable.

2. Description of the Prior Art

Figure 12:
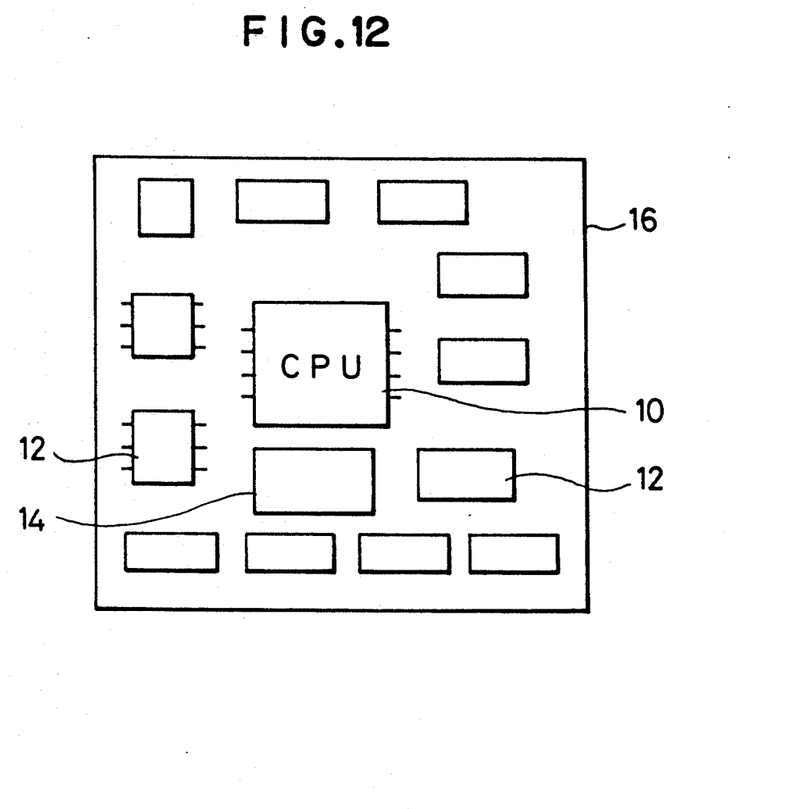
FIG. 12 is a plan view illustrating the arrangement of a prior one-board computer.

In a prior one-board computer, there are disposed on a system board 16, as illustrated in FIG. 12 for example, a chip 10 of a central microprocessor, varieties of general purpose ICs 12 (such as TTLs, RAMS, ROMS, etc.), and a peripheral circuit composed of a very small number of programmable logic devices (PLD) 14 for use in decoding of any addresses.

It is impossible to reconfigure the prior one-board computer to another circuit for other applications after having once been assembled.

Additionally, when a newly designed logic circuit is altered to an actual circuit on the one-board computer, it can not utilized any data of the prior one-board computer which is design property. A new design must be done from the beginning each time a newly designed logic circuit is needed.

Further, an LSI (large scale integrated) circuit includes many constituent parts with complicated relations thereamong. Therefore, a designer can predict all results in each design process. Moreover, even in a prototype process of such a design, any wrong design results in very high costs. For reducing the possibility of such design error there has been an increase in demand for a computer tool which a designer can analyze and verify a designed circuit prior to expensive manufacture of silicon devices.

The prior practice to design an IC is as follows:
1) the step of an abstract idea in designers thoughts,
2) the step of architecture specifications (register transfer level (RTL)) that is, for example, a combination of black boxes,
3) the step of a schematic logical design (gate level) that is, for example, a combination of circuit blocks,
4) the step of a circuit design (transistor level) that is a combination of transistor circuits, and
5) the step of a mask layout on silicon wafers.

The practice also includes the step of a design on testing of any fault of a finished product.

Accordingly, in order to design a large-scale system and realize it with a combination of actual large scale integrated circuit, the verification is very important to cheek whether or not the design is proper.

For the prior verifications works, there are also various design steps. In the first step, where the abstract idea is existent in designer's thoughts, a designer performs the verification in his thoughts. Then, in the successive RTL level, the designer likewise performs the verification in his thoughts or performs functional simulation through a logic simulator with the aid of a computer. Also in the successive gate level, the designer performs functional simulation through a logic simulator with the aid of a computer. In the next transistor level, a timing analysis is performed through a timing simulator with the aid of a computer. Additionally, in the mask layout step, a circuit is extracted from the mask data using a computer for which a timing analysis is computed through a timing simulator. Furthermore, for the final step of testing, fault simulation is performed through a fault simulator using test vectors (test Patterns). The test vectors are prepared by the designer with the aid of a computer.

Figure 13:
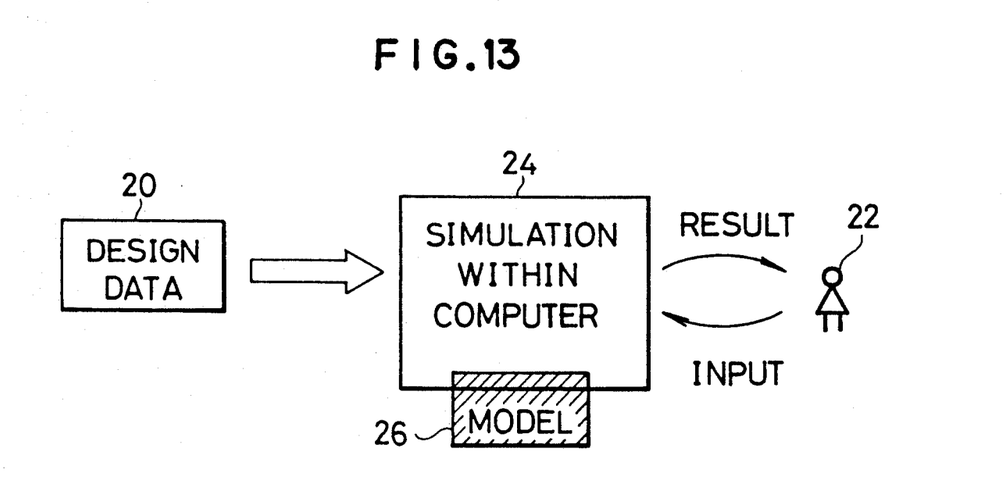
FIG. 13 is a diagram schematically illustrating a prior verification work.

In the prior verifications, however, a design circuit (design data) 20 is modeled in a computer 24, and the computer 24 evaluates the simulated resulting model 26. Therefore, for the logic simulation of 10000 gates, for example, which is performed by a 1MIPS machine, verification thereof requires the time exceeding one hour. For logic simulation beyond a transistor level, verification requires much more time. Additionally, since a designer 22 inputs a design circuit 20 into the computer 24 in the form of a model, wrong verifications will likely happen. Further, timing do not satisfactorily correspond to actual situations.

In order to estimate whether a test vector for verification is adequate or not, it is necessary to intentionally produce internal failures such as element failure or disconnection failure at various portions of a modeled logic circuit for examination of a failure detection rate by the test vector. In a circuit for which no failure detection is taken into consideration, the rate might be 70% or less in a simple failure, and in a circuit where failure detection is taken into consideration, the rate is about 95% or more in a similar simple failure. However, in a system where failures are produced one by one at each portion of a modeled logic circuit, each test vector is generated by computation, and it is necessary to repeat computation for each failure. Therefore, even through a test vector operation that takes about three seconds, accurate estimate of a failure detection rate takes about a week.

Additionally, obtaining an output pattern as a reference for comparison when an input pattern for a device under testing (DUT input pattern) is inputted into the device, similar required computation takes a long period of time.

Alternatively, another known technique is disclosed in Japanese Laid-Open Publication Nos. 62-93736 and 63-157072. Instead of using the software simulator to check a operation of an LSI circuit, the hardware simulator is prepared by specifying a necessary integrated circuit module and writing code data corresponding to logic specifications into a PLD of the specified integrated circuit module.

The hardware simulator, however, includes ICs arranged regularly such as PLDS, EPROMS, and RAMS, etc., into which varieties of serial IC modules can be optionally incorporated. Many other IC modules that might be unnecessary depending upon the associated logic circuit results in a complicated structure thereof.

SUMMARY OF THE INVENTION

In view of the drawbacks with the prior art, it is a first object of the present invention to provide a Programmable one-board computer capable of accepting versatile systems and of being responsive to the alteration of such a system rapidly and easily.

A second object of the present invention is to provide a method of easily altering a designed logic circuit to an actual circuit including a PLD with use of design property on combinations of actual circuit of PLDs and corresponding partial circuit that have already been designed.

A third object of the present invention is to provide a method of verification of a logic circuit. The method being capable of verifying and estimating a designed logic circuit and a test vector in a short period of time. Each design step uses a verification circuit actually realized with use of a PLD.

A fourth object of the present invention is to assure rapid estimation of a test vector with use of an actual verification circuit.

A fifth object of the present invention is to assure rapid preparation of an output pattern when a DUT input pattern is inputted using an actual verification circuit.

In accordance with one aspect of the present invention, a programmable one-board computer comprises, for achieving the first object, a system board including wirings, at least one microprocessor chip disposed substantially at the center of said system board, and a plurality of programmable logic devices disposed to substantially surround the circumference of the microprocessor chip.

Likewise, a programmable one-board computer comprises, for also achieving the first object, a system board including wirings, at least one microprocessor chip disposed substantially at the center of said system board, and a plurality of large scale programmable logic devices each disposed to substantially surround the circumference of the microprocessor chip, and a plurality of small scale programmable logic devices each disposed outside the large scale programmable logic devices.

The programmable one-board computer can further comprise a memory device for defining an internal circuit of each programmable logic device.

Or, part of the programmable logic devices can include a memory for a computer system.

Or, a memory device for a computer system can be provided.

In accordance with another aspect of the present invention, a method of altering a designed logic device to an actual circuit including a programmable one-board computer of the type described above comprises, for achieving the second object, the steps of dividing the logic circuit to partial circuits A, B, C, D and E, estimating actual circuits Da, . . . of programmable logic devices corresponding to the partial circuits utilizing a data base in which there are stored many combinations of the actual circuits of the programmable logic devices corresponding to the partial circuits which have already been designed, and laying out the estimated actual circuits on a one-board computer to alter the whole logic circuit to an actual circuit.

In accordance with further another aspect of the present invention, a method of verification of a logic circuit comprises, for achieving the third object, the steps of altering a designed logic circuit to a circuit of a programmable logic device, realizing the altered circuit as an actual verification circuit including a programmable one-board computer of the type described above, and verifying the logic circuit using the circuit realized as the verification circuit.

In accordance with still another aspect of the present invention, the fourth object is achieved by estimating a test vector for fault simulation using the circuit realized as the verification circuit.

Additionally, in accordance with a still further aspect of the present invention, the fifth object of the present invention is achieved by creating an output pattern from the logic circuit when a DUT input pattern is inputted, using the circuit realized as the verification circuit.

In the present invention, a plurality of programmable logic devices substantially surround the circumference of at least one microprocessor disposed substantially at the center of a system board, whereby almost all the peripheral circuits of an existing one-board computer are transplanted onto a programmable logic device which is capable of erasing/reconfiguration of such a circuit.

The present invention can therefore accept a versatile system as well as accept system alteration and the like rapidly and easily. Accordingly, the present invention is preferable for use in testing devices and the like, upon development of new functional digital semiconductor integrated circuits such as new single chip microcomputers, and also applicable to other applications.

Additionally, when the programmable logic devices are hierarchically structured, and small scale programmable logic devices are disposed outside large scale programmable logic devices, the programmable one-board computer of the present, invention is preferable for hierarchical control and hierarchically structured systems.

Moreover, when there are provided memory devices for defining an internal circuit of the programmable logic device, the memories are unnecessary.

Furthermore, when part of the programmable logic devices include a memory for a computer system, an external memory device is unnecessary. This assures high speed operation.

Additionally, when there is provided a memory device for a computer system, it is unnecessary for a programmable logic device to include a computer system memory.

In the present invention, data for an ordinary exclusive computer board is utilized as design property, and many combinations of PLD actual circuits corresponding to partial circuits which have already been designed are stored in a data base. A designed logic circuit is divided into partial circuits, and PLD actual circuits corresponding to those partial circuits are estimated with use of the data base and laid out to alter the whole logic circuit to an actual circuit. An actual circuit including a PLD can easily be established utilizing conventional design property.

Particularly, when the actual circuit is realized on a programmable one-board computer including at least one microprocessor chip disposed substantially at the center of a system board and a plurality of PLDs disposed to substantially surround the circumference of the microprocessor.chip, the logic circuit can easily be laid out on the programmable one-board computer for realization of the actual circuit.

Figure 7:
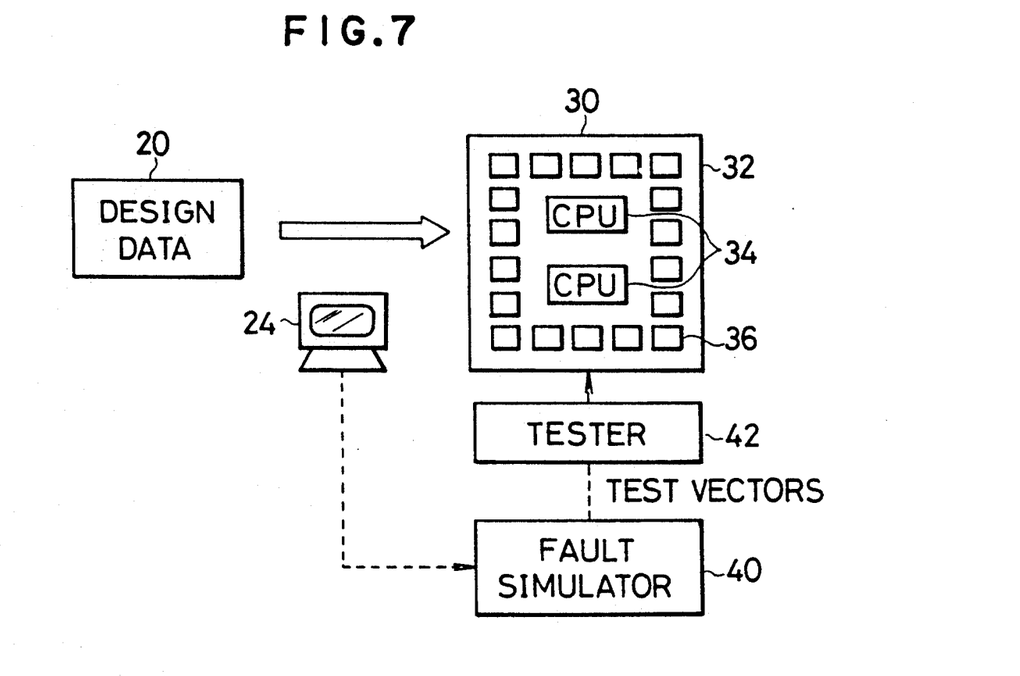
FIG. 7 is a diagram schematically illustrating the method of alteration to a verification circuit as an exemplary actual circuit realized by the present invention, and illustrating a verification method using the resulting verification circuit.

In the present invention, as illustrated in FIG. 7, a designed logic circuit (design data) 20 is altered to a programmable logic device (PLD) circuit with use of a development tool 24 for example, which is then realized as an actual verification circuit including a PLD, for example, a Programmable one-board computer 30 which includes at least one (two in the figure) microprocessor (CPU) chip 34 disposed substantially at the center of a system board 32 and a plurality of PLDs 36 disposed to substantially surround the circumference of the CPU chip 34. The realized circuit as the verification circuit (30) is then used to verify the function and timing of the logic circuit 20 with use of a tester 42 into which test vectors are inputted from a fault simulator 40. Thus, the logic circuit 20 is realized as the verification circuit (30) of a simple structure for verification work on an actual circuit Therefore, any verification can be performed in real time which is much shorter than computation time and hence, verifications can rapidly be completed. Since an actual circuit is used, the possibility of wrong verification is sharply reduced. Additionally, the use of the circuit of a programmable logic device simplifies the whole construction and facilitates any alteration of a designed logic circuit to a verification circuit.

When the programmable one-board computer 30 is used as the verification circuit, an arbitrary verification circuit can also be realized with ease.

For logic circuits 20 of the present invention, i.e., for design data, a flow chart method proposed by Nr. Nick Tredennck (refer to COMPUTER, 81, 12, PP 87 to 102) is available. The flow chart method is one of the procedures to design a computer process and available data with use of an arbitrary operation descriptive language. Additionally, schematic data representative of a combination of circuit blocks is available at the gate level. At the transistor level, there is available data for a transistor circuit diagram. At the layout level, there is available circuit data by a combination of circuit elements extracted from a mask layout.

Figure 10:
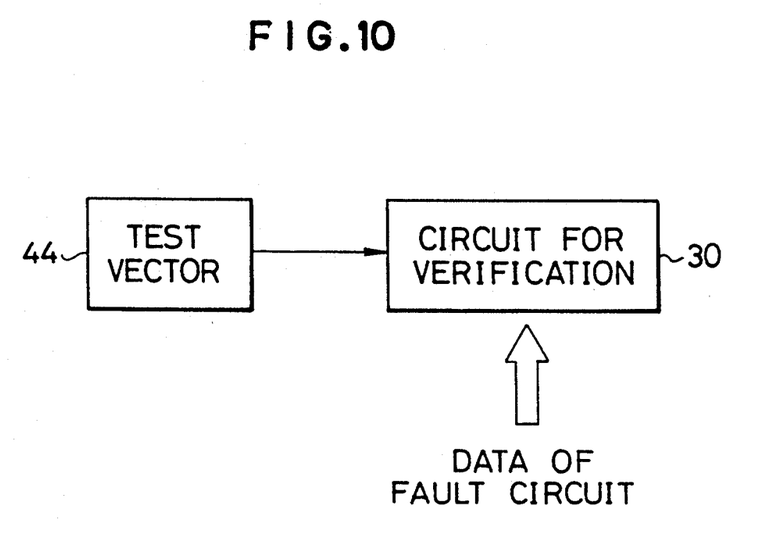
FIGS. 10 and 11 are diagrams each schematically illustrating the method of verification of a logic circuit according to the present invention.

Moreover, at the testing level, product test data (test vectors 44) is created by an arbitrary method from arbitrary stage design data of a simulation engine, a fault simulator, a test vector generator, etc. Specifically, since any arbitrarily produced trouble can be implemented into an actual machine (30) as shown in FIG. 10, operation time of test vectors in the unit of a second or a minute can be estimated in real time.

Therefore, even a final stage test vector that conventionally took over one week can quickly be estimated and created.

Figure 11:
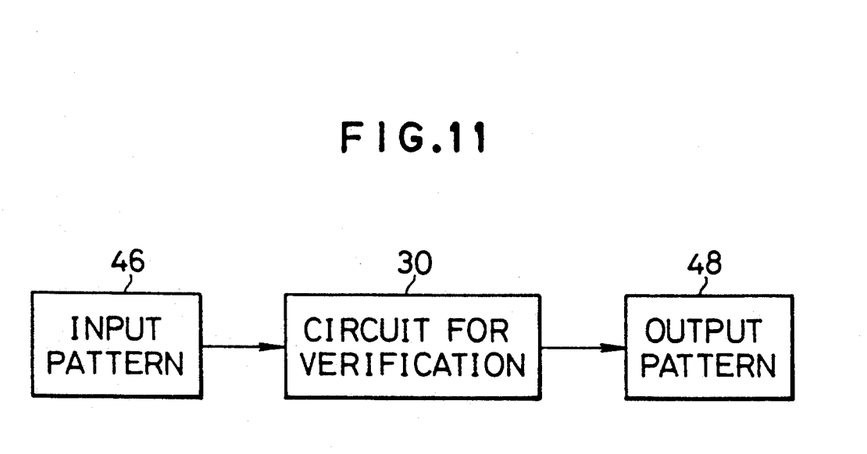

Furthermore, as illustrated in FIG. 11, an output pattern 48 of a device under testing input pattern (DUT input pattern) 46 can also be prepared very rapidly in real time.

BRIEF DESCRIPTION OF THE DRAWINGS

The exact nature of this invention, as well as other objects and advantages thereof will be readily apparent from consideration of the following specification relating to the accompanying drawings, in which like reference characters designate the same or similar parts throughout the figures thereof and wherein.

DESCRIPTION OF THE PREFERRED EMBODIMENT

In what follows, preferred embodiments of the present invention will be described with reference to the accompanying drawings.

Figure 1:
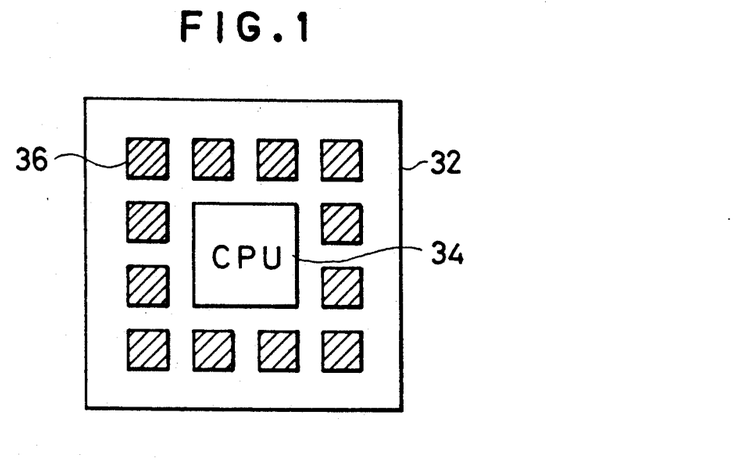
FIG. 1 is a plan view illustrating the arrangement of a first embodiment of a programmable one-board computer according to the present invention.

A first embodiment of a programmable one-board computer according to the Present invention comprises, as illustrated in FIG. 1, a system board 32 including wirings (not shown), a single microprocessor (CPU) chip 34 disposed substantially at the center of the system board 32, and a Plurality of (12 in the figure) Programmable logic devices (PLD) 36 disposed to substantially surround the circumference of the microprocessor chip 34.

In the first embodiment, there is included in the PLD 36 memory (SRAM and EPROM, for example) for defining an internal circuit of the PLD. Therefor, the embodiment can accept a versatile system by defining the memory while matching it with such a system using an external development tool. Additionally, the embodiment can accept such a system rapidly and easily by rewriting the memory when the system is altered.

In the present embodiment, since the PLDs include the memory for defining the internal circuit thereof, the system board 32 does not require any external memory device, which allows very simple construction and flexibility.

Figure 2:
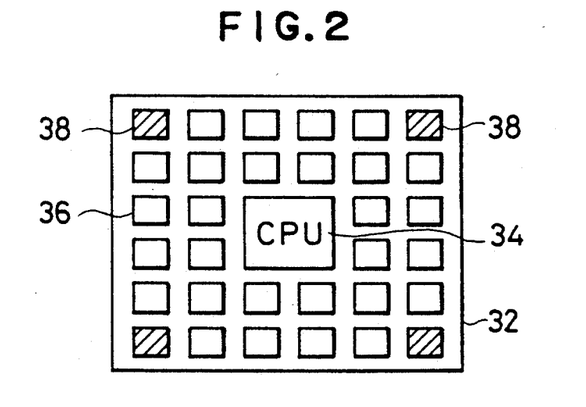
FIG. 2 is a plan view illustrating the arrangement of a second embodiment of the same.

Successively, a second embodiment of the programmable one-board computer of the present invention will be described with reference to FIG. 2.

In the second embodiment, in a similar one-board computer to that in the first embodiment, the PLDs 36 are further increased to surround the CPU chip 34, twice for example. To define the external memory devices for the internal circuits of the PLDS, PROMs 38 are disposed at the four corners.

The present embodiment can access a versatile system by defining the internal circuit of the PLDs by the PROM 38.

In the present embodiment, since the external PROM 38 is provided on the system board 32, the operation is rather effective depending on an associated system.

Figure 3:
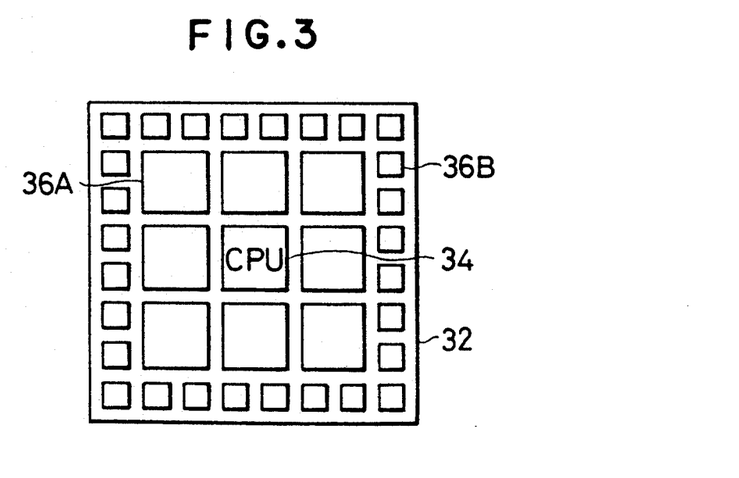
FIG. 3 is a plan view illustrating the arrangement of a third embodiment of the same.

In the following, a third embodiment of the programmable one-board computer of the present invention will be described with reference to FIG. 3.

The third embodiment comprises a system board 32 and a CPU chip 34 similar to those in the first embodiment, a plurality of (8 in the present case) large scale programmable logic devices (PLD) 36A disposed to substantially surround the circumference of the CPU chip 34, and a plurality of (28 in the present case) small scale PLDs 36B disposed outside the large scale PLDs 36A.

Figure 4:
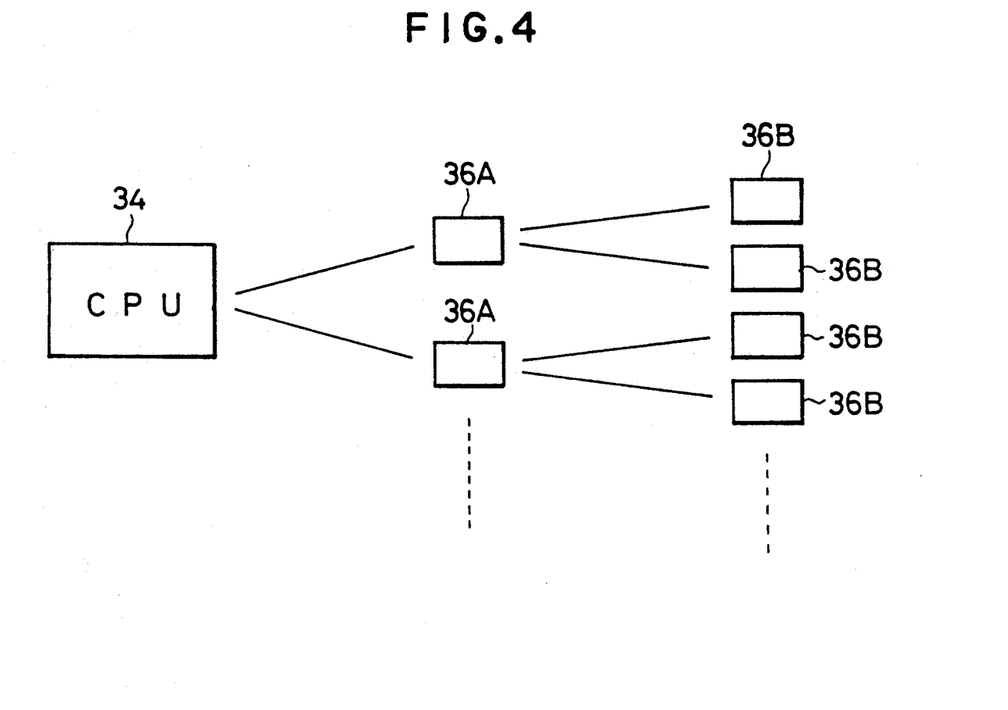
FIG. 4 is a diagram illustrating the hierarchical structure of the third embodiment.

In the present embodiment, there is facilitated, as illustrated in FIG. 4, circuit definition of the construction that corresponds to large and small size PLDs connected in a hierarchical structure, the so-called hierarchy design. More specifically, there is large-sized a circuit as a co-processor circuit. It is directly coupled to a CPU and receives from and delivers to the CPU at a high speed for executing partial data processing jointly with the CPU. The circuit may be defined within the large scale PLD 36A. In the present embodiment, the large scale PLD 36A is located in the vicinity of the CPU chip 34 so that the embodiment is capable of high speed operation with high efficiency and is preferable for a hierarchical structure system.

In this third embodiment, it is possible to replace part of the large scale PLDs 36A or the small scale PLDs 36B by the PROM 38 used in the second embodiment.

Figure 5:
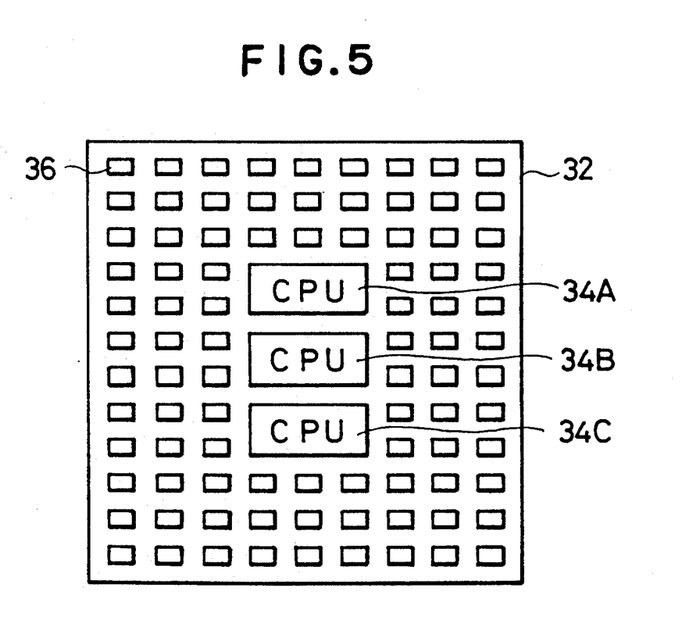
FIG. 5 is a plan view illustrating the arrangement of a fourth embodiment of the present invention.

Successively, a fourth embodiment of the programmable one-board computer of the present invention will be described with reference to FIG. 5.

In the fourth embodiment, in a similar one-board computer to that in the first embodiment, there are provided a plurality of CPU chips (three of 34A, 34B, and 34C in the figure) by changing makers and a bit number such as 8, 16, and 32 bits, etc.

In accordance with the present embodiment, makers and a bit number of the CPU chip are selected in conformance with the system, allowing a board size to be increased but improving the flexibility of the invention.

Although the commercially available microprocessor chips 34, 34A, 34B, and 34C used include memories and I/O circuits, the microprocessor chip may also be suffice to only include a center core.

In the above case, the circumferential PLDs can be available as memories and I/O circuits which are included in a typical microprocessor. The invention is advantageous to the development of CPUs. Herein, there may be provided, independently on the system board 32, peripheral circuits of the microprocessor that are difficult to be constructed, such as A/D converter, D/A converter, DC/DC converter, ELD (Electronic Luminescence Display) driver, power failure detection circuit, multiplier, FFT processor, and cash tag memory.

Additionally, for the foregoing PLDs 36, 36A, and 36B, those including a computer system memory may be useable. This situation assures fast access and hence high speed operation, because the PLD includes a computer system memory. It is of course possible to provide external computer system memories such as DRAMs and ROMs on the system board 32 independently of the PLDS.

Successively, embodiments of a method of alteration to an actual circuit and a verification method according to the Present invention will be described with an example wherein a verification circuit is laid on a programmable one-board computer to verify a newly designed logic circuit.

In the present embodiment, as illustrated in FIG. 7, a designed logic circuit (design data) 20 is altered to a programmable logic device (PLD) circuit using a development tool 24 which is then realized as an actual verification circuit including a PLD, e.g., a programmable one-board computer 30 that includes at least one (two in the figure) microprocessor (CPU) chip 34 disposed substantially at the center of the system board 32 and a plurality of the PLDs 36 disposed to substantially surround the circumference of the CPU chip 34.

The circuit realized as the verification circuit (30) is used for verification of the function and timing, etc., of the logic circuit 20 through a tester 42 into which a test vector is inputted from a fault simulator 40.

Figure 8:
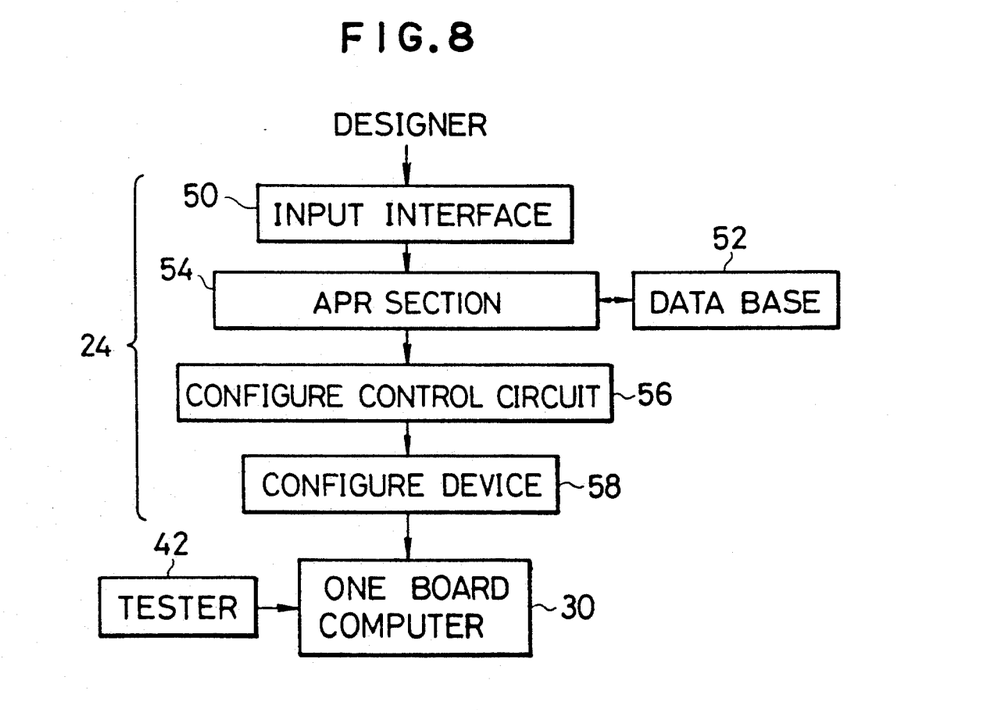
FIG. 8 is a block diagram exemplarily illustrating the arrangement of an apparatus for performing the alteration to an actual circuit according to the present invention.

For the alteration to an actual circuit and the verification of a logic circuit according to the present invention, as illustrated in FIG. 8 for example, the development tool 24 is used. The development tool 24 comprises an input interface unit 50 into which a logic circuit designed by a designer is inputted, a data base 52 in which there are stored many alteration data of combinations of conventional partial circuit having already been designed and PLD actual circuits, an APR (Automatic Placement Router) section 54 for altering a logic circuit inputted from the input interface unit 50 to create actual circuits of PLDs based upon the data stored in the data base 52, and a configure control circuit 56 and a configure device 58 for realizing the circuit altered by the APR section 54 as an actual verification circuit including PLDS, the aforementioned programmable one-board computer 30, for example.

Figure 9:
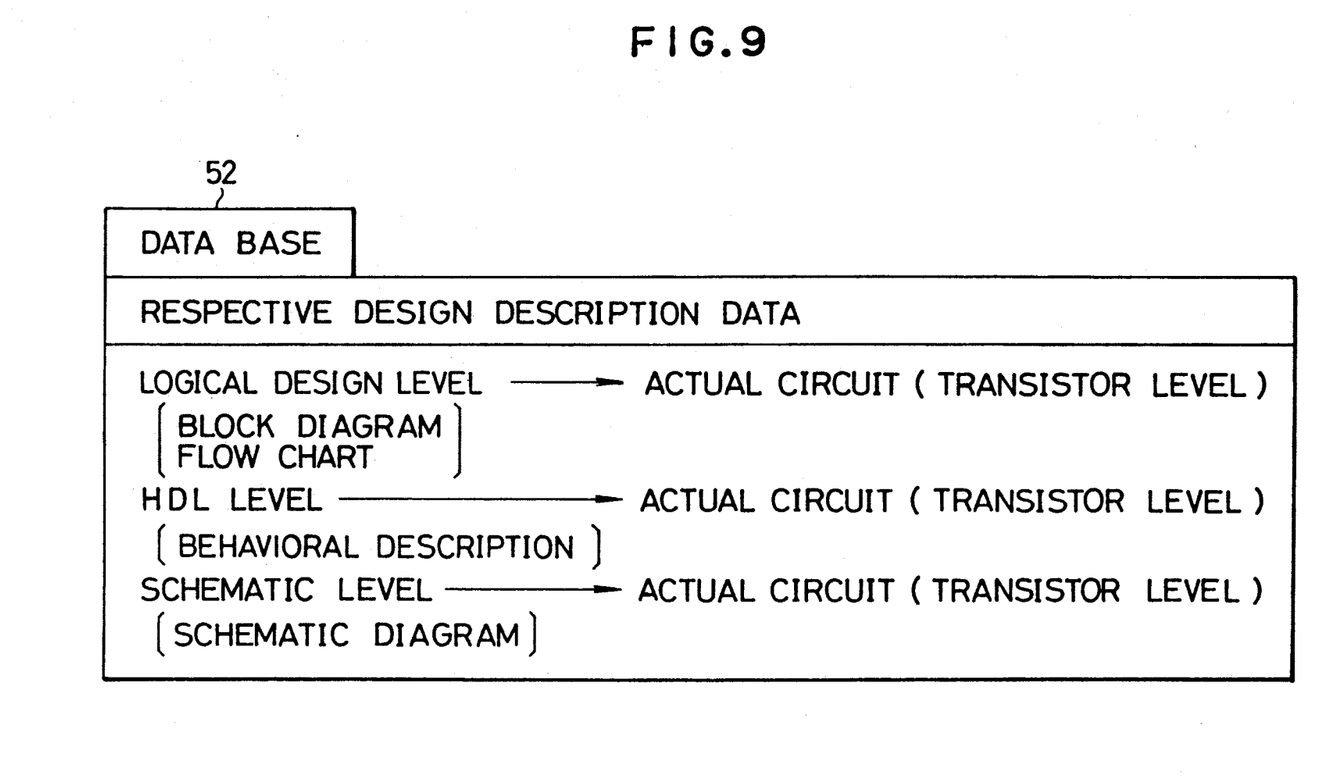
FIG. 9 is a diagram exemplarily illustrating a data base provided in the apparatus.

In the data base 52, as illustrated in FIG. 9, a big volume of data are stored in the form of libraries as design property for each corresponding partial circuit, such data including combinations of: designs of prior partial (peripheral) circuits in respective design steps, for example, a logical design level including block diagrams, flow charts, state transition tables, state transition maps, etc.; a hardware description language (HDL) level including function description expressed by definition formula including a code representative of the current status and a code representative of the next status; and a schematic level including a schematic diagram expressed by symbols and data of transistor level PLD circuits yielded by realizing the designs of the prior Partial circuits. The combinations of designs prior partial circuits and of data of transistor level PLD circuits being used to decide for example, what microprocessor is used, how many microprocessors are used, what peripheral chip (memory, TTL, PLD, and the like) is used, how many peripheral chips are used, how they are wired and connected, etc.

Figure 6:
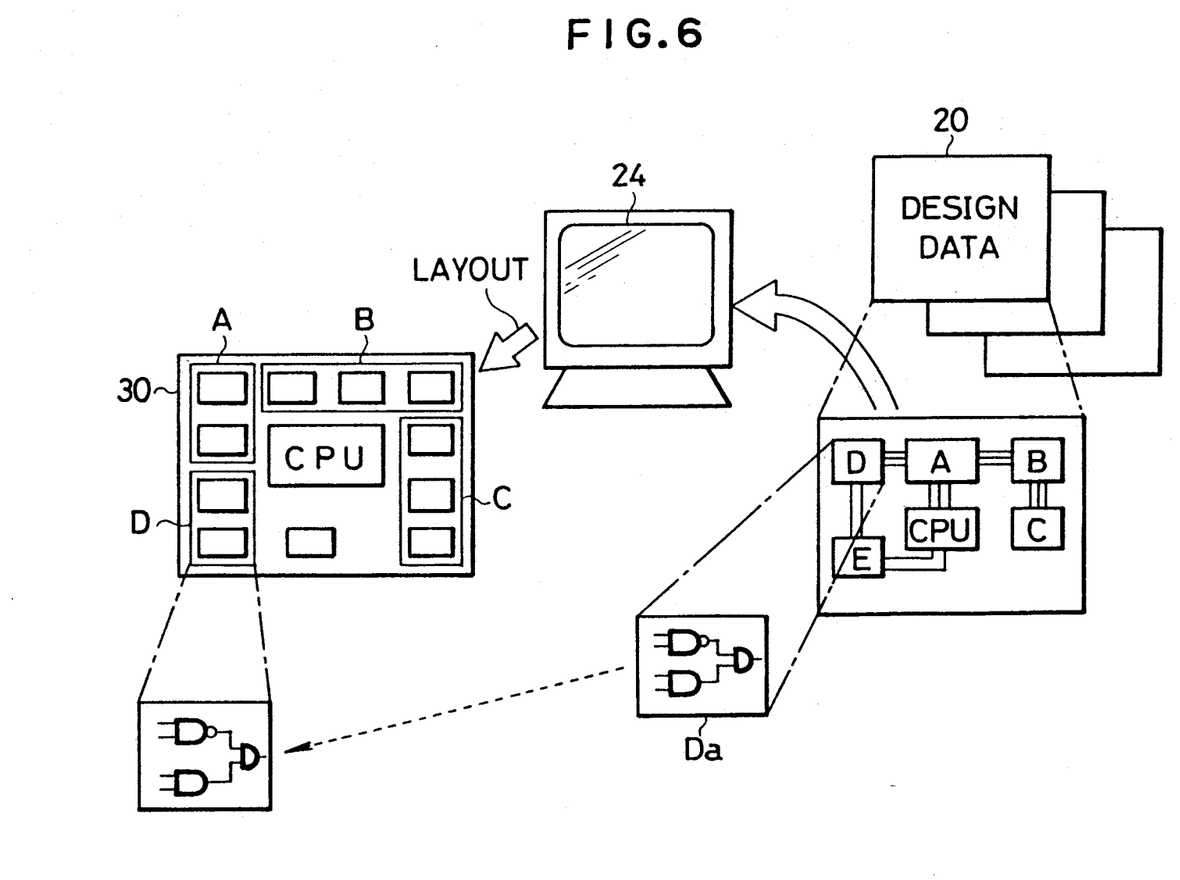
FIG. 6 is a diagram schematically illustrating a method of altering a logic circuit to an actual circuit according to the present invention.

Accordingly, as illustrated in FIG. 6, the calculating section 54 selectively takes out from the data base 52 actual circuits Da corresponding to the partial circuits A, B, C, D and E yielded by dividing the input logic-circuit 20. The partial circuits are laid out on the PLDs in the one-board computer 30. The calculating section determines the arrangement and wirings of the logic circuit.

Upon the alteration to an actual circuit, logical design level data may sometimes be difficult to be directly altered to an actual circuit. To solve this problem, the data may be lowered to the HDL level and the design level data may then be altered to an actual circuit.

Thus, a test signal is inputted into the verification circuit realized on the programmable one-board computer 30 through the tester 42, whereby real time verification work is achieved with use of the actual circuit.

Additionally, for estimating a fault detection rate of test vectors, data of failure circuits, which are obtained by intentionally producing internal failures such as bad elements and disconnections, are employed instead of the design data to realize the failure circuit on the one-board computer 30. The test vector is inputted into the one-board computer 30 to rapidly estimate in real time the fault detection rate of the test vector, as illustrated in FIG. 10.

Furthermore, for preparing an output pattern corresponding to a test pattern, the test pattern is inputted into a verification circuit realized on the one-board computer 30 to rapidly obtain in real time a corresponding output pattern, as illustrated in FIG. 11. Therefore, any combination of such input and output patterns can be easily yielded As described above, the logic circuit 20 is realized as a verification circuit for verification of an actual circuit so that rapid verification is achievable in real time which greatly shorter than computation time. In particular, use of an actual circuit sharply reduces the possibility of any mistakes. In addition, the use of a programmable logic device circuit facilitates alteration of a designed logic circuit to an actual circuit. Use of the Programmable one-board computer 30 as a device for realization of an actual circuit assures realization of an arbitrary actual circuit with ease. More specifically, the PLD 36 for example includes therein memory (SRAM or EPROM, for example) for defining an internal circuit thereof, whose memory is then defined after an associated system using the development tool 24. Hereby, the programmable one-board computer can accept a versatile system. Further, even if the system is changed, the programmable one-board computer can accept such a change rapidly and easily by rewriting the above memory.

In the present embodiment, the memory for defining an internal circuit of a PLD is included in the PLD so that the need of provision of external memory devices in the system board 32 is eliminated to result in a very simple and flexible construction.

Additionally, in the above described embodiment, there are provided as means to realize an actual circuit on the one-board computer 30 comprising two CPU chips and many PLDs. Makers for those CPU chips and a bit number of the same are selectable in conformance with an associated system, resulting in very high flexibility of the device. There is no limit to types of one-board computers for realizing any actual circuit. For example, as the foregoing modification illustrated in FIG. 2, the number of the PLDs 36 may further be increased to surround the CPU 34 twice. To define the external memories for the internal circuit of the PLD 36, PROMs 38 may be dispose at the four corners as illustrated in FIG. 2. Alternatively, in another modification as illustrated in FIG. 3, there may be available an one-board computer comprising a plurality (eight in the figure) of large scale programmable logic devices (PLDS) 36A disposed to substantially surround the circumference of the CPU 34 and a plurality (28 in the figure) of small scale PLDs 36B disposed outside the large scale PLDs 36A.

What is claimed is:

1. A programmable one-board computer comprising:
   (a) a system board having a plurality of wirings;
   (b) at least one microprocessor chip disposed substantially at the center of said system board; and
   (c) a plurality of programmable logic devices substantially surrounding said microprocessor chip, said plurality of wirings interconnecting at least one of said plurality of programmable logic devices to said at least one microprocessor chip.

2. A programmable one-board computer according to claim 1 further comprising memory devices for defining internal circuits of said plurality of programmable logic devices.

3. A programmable one-board computer according to claim 1 wherein at least one of said plurality of programmable logic devices has a memory for a computer system.

4. A programmable one-board computer according to claim 1 further comprising at least one memory coupled to at least one of said plurality of programmable logic devices by said plurality of wirings for a computer system.

5. The programmable one-board computer of claim 1, wherein said plurality of wirings intercouple said plurality of programmable logic devices.

6. A programmable one-board computer comprising:
   (a) a system board having a plurality of wirings;
   (b) at least one microprocessor chip disposed substantially at the center of said system board;
   (c) a plurality of large scale programmable logic devices disposed on said system board to substantially surround the circumference of said microprocessor chip, said plurality of wirings interconnecting at least one of said plurality of large scale programmable logic devices to said at least one microprocessor chip; and
   (d) a plurality of small scale programmable logic devices disposed outside said large scale programmable logic devices, said plurality of wiring interconnecting at least one of said plurality of small scale programmable logic devices to at least one of said plurality of large scale programmable logic devices.

7. The programmable one-board computer of claim 6 further comprising at least one memory coupled to said at least one microprocessor chip.

8. The programmable one-board computer of claim 6 further comprising at least one memory coupled to at least one of said plurality of large scale programmable logic devices by said plurality of wirings.

9. The programmable one-board computer of claim 6 further comprising at least one memory coupled to at least one of said plurality of small scale programmable logic devices by said plurality of wirings.

10. The programmable one-board computer of claim 6 wherein said plurality of large scale programmable logic devices are coupled to said plurality of small scale programmable logic devices by said plurality of wirings in a hierarchial structure.

11. A method of altering programmable logic devices of a programmable one-board computer to an actual circuit of a computer system, the method comprising the steps of:
   (a) inputting a designed logic circuit into a development tool;
   (b) dividing said designed logic circuit into partial circuits stored in said development tool;
   (c) correlating said partial circuits with actual circuits of programmable logic devices which have already been designed and stored in a data base of said development tool;

(d) using said actual circuits of programmable logic devices which have already been designed on the programmable logic devices of the programmable one-board computer to alter the programmable logic devices to create the actual circuit of the computer system.

12. A method of verifying operations of a logic circuit comprising the steps of:
(a) dividing a designed logic circuit using a development tool into portions that may be represented by pre-stored programmable logic device circuits;
(b) alternating programmable logic devices of a programmable one-board computer to correlate with said pre-stored programmable logic device circuits so as to form an actual circuit that equates to said logic circuit;
(c) inputting test signals into said actual circuit; and
(d) monitoring outputs of said actual circuit to verify the operations of the logic circuit.

13. A method of verifying operations of a logic circuit according to claim 12 wherein said test signals are a test vector for fault simulation to produce internal failures within said actual circuit as to rapidly estimate in real time a fault detection rate of said test vector.

14. A method of verifying operations of a logic circuit according to claim 12 wherein said test signals are input patterns to rapidly obtain real time output patterns of the actual circuit.

* * * * *